US009528195B2

(12) United States Patent
Moon et al.

(10) Patent No.: US 9,528,195 B2
(45) Date of Patent: Dec. 27, 2016

(54) DEVICE FOR MANUFACTURING SEMICONDUCTOR OR METALLIC OXIDE INGOT

(75) Inventors: Sang Jin Moon, Daejeon (KR); Won Wook So, Daejeon (KR); Dong Soon Park, Daejeon (KR); Myung Hoi Koo, Daejeon (KR)

(73) Assignee: KOREA RESEARCH INSTITUTE OF CHEMICAL TECHNOLOGY, Daejeon (KR)

( * ) Notice: Subject to any disclaimer, the term of this patent is extended or adjusted under 35 U.S.C. 154(b) by 328 days.

(21) Appl. No.: 14/239,227

(22) PCT Filed: Aug. 17, 2012

(86) PCT No.: PCT/KR2012/006540
§ 371 (c)(1),
(2), (4) Date: Feb. 17, 2014

(87) PCT Pub. No.: WO2013/025072
PCT Pub. Date: Feb. 21, 2013

(65) Prior Publication Data
US 2014/0150717 A1 Jun. 5, 2014

(30) Foreign Application Priority Data

Aug. 18, 2011 (KR) .................. 10-2011-0082476

(51) Int. Cl.
*C30B 35/00* (2006.01)
*C30B 11/00* (2006.01)
(Continued)

(52) U.S. Cl.
CPC ............ *C30B 11/003* (2013.01); *B29C 39/38* (2013.01); *B29C 39/44* (2013.01); *C30B 11/006* (2013.01);
(Continued)

(58) Field of Classification Search
CPC ....... C30B 35/00; C30B 11/003; C30B 11/006
See application file for complete search history.

(56) References Cited

U.S. PATENT DOCUMENTS 7,918,936 B2* 4/2011 Schmid ................ C30B 11/007
117/21
8,101,020 B2* 1/2012 Sarayama ................ C30B 9/00
117/81
(Continued)

FOREIGN PATENT DOCUMENTS

DE 69623585 T2 5/2003
DE 102009022412 A1 11/2010
(Continued)

OTHER PUBLICATIONS

International Search Report mailed Feb. 21, 2013; PCT/KR2012/006540.
(Continued)

*Primary Examiner* — Robert M Kunemund
(74) *Attorney, Agent, or Firm* — Ladas & Parry LLP

(57) ABSTRACT

Provided is an apparatus for manufacturing a semiconductor or metal oxide ingot by sequentially inducing a liquid-to-solid phase transition of a liquid raw material following a solidification direction, the apparatus including: a crucible containing a semiconductor or metal oxide raw material; a cooling unit spaced apart from the crucible at a predetermined distance in a vertical direction, when a height direction of the crucible is designated by the vertical direction and a direction perpendicular to the vertical direction is designated by a horizontal direction; a first heating unit spaced apart from the crucible at a predetermined distance in the horizontal direction and surrounding a circumferential surface of the crucible; and an insulating member provided between the crucible and the cooling unit in the horizontal
(Continued)

direction, a position of the insulating member being shifted by a shifting unit.

17 Claims, 7 Drawing Sheets

(51) Int. Cl.
*C30B 29/06* (2006.01)
*C30B 29/20* (2006.01)
*C30B 29/40* (2006.01)
*B29C 39/38* (2006.01)
*B29C 39/44* (2006.01)

(52) U.S. Cl.
CPC .............. *C30B 29/06* (2013.01); *C30B 29/20* (2013.01); *C30B 29/40* (2013.01); *Y10T 117/1092* (2015.01)

(56) References Cited

U.S. PATENT DOCUMENTS

| | | | | |
|---|---|---|---|---|
| 8,268,074 | B2* | 9/2012 | Hugo | ................... C30B 11/00 117/200 |
| 2009/0090296 | A1* | 4/2009 | Gil | ..................... C30B 11/002 117/200 |
| 2009/0280050 | A1 | 11/2009 | Ravi et al. | |
| 2010/0101387 | A1 | 4/2010 | Gupta et al. | |

FOREIGN PATENT DOCUMENTS

| | | |
|---|---|---|
| JP | 09-183606 A | 7/1997 |
| WO | 2010/133200 A1 | 11/2010 |

OTHER PUBLICATIONS

German Office Action dated Mar. 24, 2016; File Ref: 11 2012 003 423.6.

* cited by examiner (a)

(b)

(a)

(b)

(c)

(a)

(b)

(c)

(a)

(b)

(c)

DEVICE FOR MANUFACTURING SEMICONDUCTOR OR METALLIC OXIDE INGOT

TECHNICAL FIELD

The present invention relates to an apparatus for manufacturing an ingot, and more particularly, to an apparatus for manufacturing a semiconductor or metal oxide ingot by sequentially inducing a liquid-to-solid phase transition of a liquid semiconductor or metal oxide raw material following a solidification direction.

BACKGROUND ART

Recently, the development of solar power generation by crystalline silicon solar cells has reached commercialization, following testing, due to the advantages thereof in view of non-pollution, safety, high performance, and reliability.

As a result, about several to several tens of MW of mass solar power generation has been made by using the silicon solar cells in Germany, Canada, USA, and the like.

The solar cell currently used in the solar power generation is produced by using a monocrystalline silicon ingot manufactured by the Czochralski pulling method or a polycrystalline silicon ingot manufactured by the Bridgman method. It is recognized that prices of the silicon ingot and substrate need to be lowered while product quality and productivity need to be further improved in view of future continuous increase in the capacity and improvement in economic feasibility.

By considering this background, considerable efforts have been made in efficiently producing high-quality polycrystalline or monocrystalline-like silicon ingot, of which physical properties do not significantly deteriorate as compared with those of monocrystalline silicon ingot and production costs are easily reduced.

Basically, the manufacture of the polycrystalline silicon ingot as well as the monocrystalline-like silicon ingot for the solar cell is characterized by directional solidification. Particularly, the monocrystalline-like silicon ingot is manufactured by further using monocrystalline seeds.

When the monocrystalline seeds are installed on the lowest portion of a crucible made of quartz or graphite and a solar cell-grade raw silicon fills the crucible, followed by heating at 1420° C. or more, all the monocrystalline seeds and the raw silicon are melted. Here, all the raw silicon is melted while a lower portion of the monocrystalline silicon seeds are partially not melted by controlling thereof, and then, when solidification heat of the silicon is removed in one direction toward a lower portion of the crucible, solidification spreads from the seeds at the lower portion of the crucible toward an upper portion of the crucible, following the process manner of directional solidification of monocrystalline-like silicon ingot.

In the case of polycrystalline silicon ingot, the ingot obtained by a well controlled directional solidification process has a columnar structure where a large number of monocrystalline columns are integrated in one direction. When the ingot is cut perpendicularly to a crystal growth direction, the resultant substrate has a structure where electrons generated by light are collectable toward an electrode without electron loss, in like the monocrystalline ingot.

As shown in Korean Patent Laid-Open Publication Nos. 2008-0068423, 2008-0068424, 2009-0035336, and 2009-0035337, recently, this polycrystalline silicon ingot manufacturing technology is further developed, and research and development of manufacturing an ingot having polycrystalline structure almost similar to a monocrystalline structure (a monocrystalline-like structure) have been made. That is, according to this technology, the monocrystalline seeds are used like in the growth of monocrystalline ingot, but the plate-shaped monocrystalline seeds are positioned on a lower portion in the existing polycrystalline silicon ingot crucible, and a monocrystalline ingot is grown. In order to selectively melt the monocrystalline seeds and successively grow the monocrystalline ingot, a special cooling system capable of selectively cooling only a part of the lower portion of the crucible or precisely controlling a heat transfer rate in time and space needs to be developed.

Currently, a commercial sized polycrystalline silicon ingot for a solar cell has about 400~650 kg, and one ingot is manufactured for each batch in order to secure high quality. However, in order to manufacture a monocrystalline-like silicon ingot by using the existing polycrystalline ingot manufacturing apparatus, equipment such as a heat transfer system at the lower portion of the crucible or the like needs to be improved.

The technical point in the manufacture of a monocrystalline-like silicon ingot is that, when a raw material fills a lower portion in the crucible, a monocrystalline silicon seed is positioned in the lowermost portion in the crucible; at the time of melting the raw material, the melting is limited to only an upper portion of the monocrystalline silicon seed while a lower portion of the monocrystalline silicon seed is maintained in a solidified state; at the time of crystal growth, the liquid silicon is subjected to directional solidification toward a lower portion of the crucible. Here, there may be provided a good-quality ingot where the crystalline structure is a monocrystalline-like structure according to the seed used and the grain size is maintained similar to monocrystalline, resulting in significantly less crystalline defects and impurity mixing, that is, a monocrystalline-like ingot meeting the specifications of high-efficiency solar cells.

The performance of the ingot manufacturing apparatus of the related art mostly depends on the minimization in crystal defects and metal impurity mixing and maximization in columnar structure fraction, which are the main physical properties of the ingot, caused by reduction in process time required for heating and cooling.

The process factors, such as heating, cooling, and the like, are related to optimization of an apparatus such as a constitution of an insulating cooling system, and thus, arrangement of insulating materials and the like installed around a heater is important. In particular, the insulating cooling system around the crucible, which is contacted with a cooling means is very important. Therefore, it is necessary to construct a lower insulating and heat transfer system that is more elaborate than the related art, in order to manufacture a high-quality polycrystalline silicon ingot, further a monocrystalline-like, as well as other bulky semiconductor ingots or metal oxide ingots such as sapphire, that may be manufactured by a melt crystal growth method such as Czochralski.

RELATED ART DOCUMENTS

Patent Documents (Patent Document 1) Korean Patent Laid-Open Publication No. 2008-0068423
(Patent Document 2) Korean Patent Laid-Open Publication No. 2008-0068424

(Patent Document 3) Korean Patent Laid-Open Publication No. 2009-0035336
(Patent Document 4) Korean Patent Laid-Open Publication No. 2009-0035337

DISCLOSURE

Technical Problem

An object of the present invention is to provide an apparatus for manufacturing an ingot, capable of strictly controlling the melting and solidification of a raw material according to the position in a crucible; variably and precisely controlling the solidification heat generated at the time of solidifying according to the time and position at which solidification is progressed; melting the raw material in a short time; suppressing nucleation and growth on a lateral surface of a crucible; utilizing the existing ingot manufacturing apparatus without a large change thereof to thereby obtain economical profits; and allowing minimization of the apparatus.

Technical Solution

In one general aspect, an apparatus for manufacturing a semiconductor or metal oxide ingot by sequentially inducing a liquid-to-solid phase transition of a liquid raw material following a solidification direction, includes: a crucible containing a semiconductor or metal oxide raw material; a cooling unit spaced apart from the crucible at a predetermined distance in a vertical direction, when a height direction of the crucible is designated by the vertical direction and a direction perpendicular to the vertical direction is designated by a horizontal direction; a first heating unit spaced apart from the crucible at a predetermined distance in the horizontal direction and surrounding a circumferential surface of the crucible; and an insulating member provided between the crucible and the cooling unit in the horizontal direction, a position of the insulating member being shifted by a shifting unit.

The apparatus may further include a control unit controlling the shifting unit to shift the position of the insulating member, and here, the control unit controls the position of the insulating member to thereby control heat flow in the apparatus, when the raw material is melted and sequentially solidified by the heating unit and the cooling unit.

More specifically, when the raw material is melted and sequentially solidified by the heating unit and the cooling unit, the control unit controls the respective positions of the plurality of flat plates, made of an insulating material, constituting the insulating member, to thereby control a total thickness in the vertical direction of the insulating member according to the position of the insulating member between the crucible and the cooling unit.

The apparatus may further include, a control unit controlling the shifting unit to shift the position of the insulating member, wherein the control unit, controls the position of the insulating member to thereby shield between the crucible and the cooling unit when the raw material is melted by the heating unit, and controls the position of the insulating member to thereby form a penetration hole between the crucible and the cooling unit when a liquid raw material is subjected to solidification transition by the cooling unit.

The insulating member may include two or more flat plates made of an insulating material, respective positions of the two or more flat plates being independently shifted by the shifting unit, and the two or more flat plates may be different from each other in view of at least one factor selected from thickness, shape, size, and material thereof.

The insulating member may be shifted in the horizontal direction by the shifting unit.

The apparatus may further include, together with the first heating unit, a second heating unit spaced apart from the crucible at a predetermined distance in the vertical direction such that the second heating unit faces the cooling unit in the vertical direction with the crucible therebetween.

The insulating member may include two or more flat plates made of an insulating material, the two or more insulating flat plates being positioned in the same plane or different planes in the vertical direction, and at least portions of the insulating flat plates may be closely contacted with each other in the vertical direction in the case where the two or more flat plates are positioned in the different planes.

The two or more flat plates each may be independently a polygonal plate, a polygonal plate that is hollowed, a circular plate, or a circular plate that is hollowed, or may be N pieces formed by dividing a polygonal plate, a polygonal plate that is hollowed, a circular plate, or a circular plate that is hollowed, into N (N=natural number of 2 or greater).

Advantageous Effects

According to the apparatus for manufacturing an ingot according to the present invention, when the raw material is melted and sequentially solidified by the heating unit and the cooling unit, the total thickness in the vertical direction of the insulating member according to the position thereof is differently controlled according to the degree of progress of solidification, or the formation or non-formation of the penetration hole and the size of the penetration hole are controlled by shifting the insulating member, so that the heat transfer degree and the heat transfer area between the crucible and the cooling unit are controlled, thereby strictly controlling the temperature gradient according to the position inside the crucible. Further, when the raw material is sequentially solidified by shifting the insulating member, the heat transfer rate is controlled according to the selective position and the time, so that there can be provided a high-quality monocrystalline semiconductor ingot and a high-quality polycrystalline semiconductor ingot having large-size crystal grains and less crystal defects. Further, nucleation and growth on the lateral surface of the crucible can be prevented, resulting in superior productivity.

DESCRIPTION OF DRAWINGS

The above and other objects, features and advantages of the present invention will become apparent from the following description of preferred embodiments given in conjunction with the accompanying drawings, in which.

[Detailed Description of Main Elements]

Figure 1:
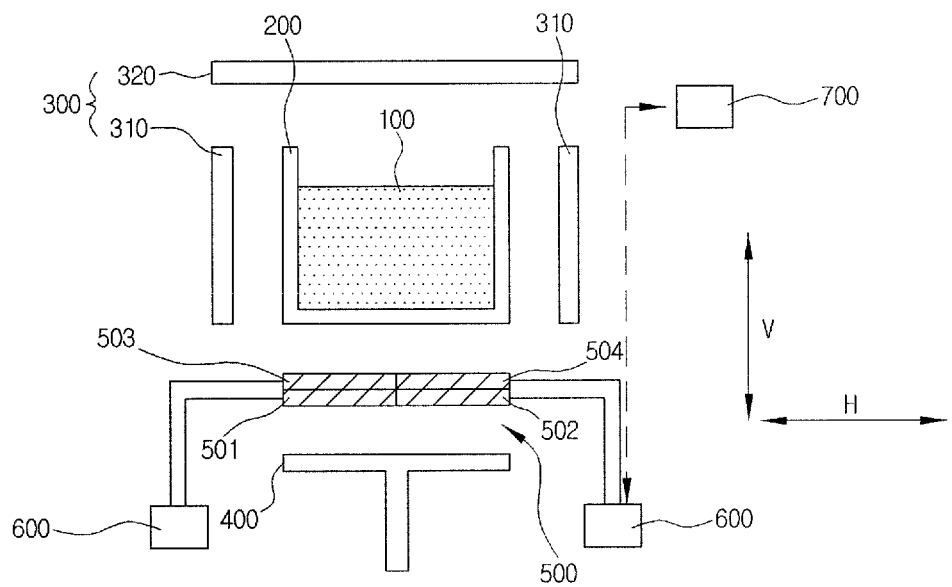
FIG. 1 is an apparatus for manufacturing an ingot according to the present invention.
Figure 1:
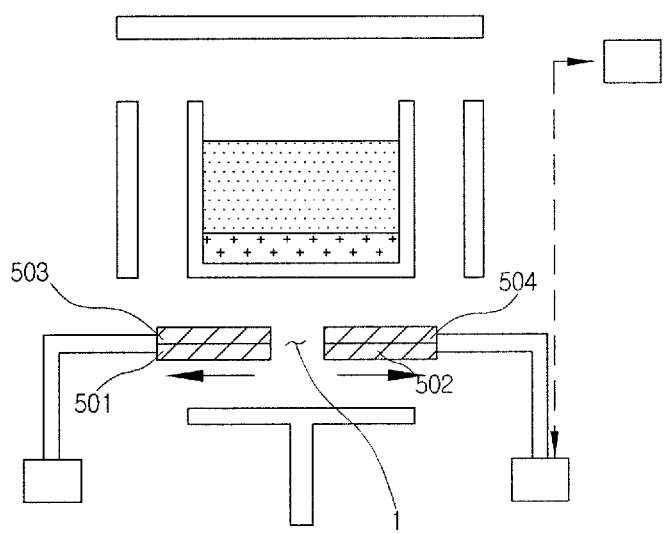

| | |
|---|---|
| 100: raw material | 200: crucible |
| 300: heating unit | 400: cooling unit |
| 500: insulating member | 501~550: flat plates |
| 600: shifting unit | 700: control unit |

BEST MODE

Hereinafter, the embodiments of the present invention will be described in detail with reference to accompanying drawings. The drawings exemplified below are provided by way of examples so that the spirit of the present invention can be sufficiently transferred to those skilled in the art to which the present invention pertains. Therefore, the prevent invention is not limited to the drawings set forth below, and may be embodied in different forms, and the drawings set forth below may be exaggerated in order to clarify the spirit of the present invention. Also, like reference numerals denote like elements throughout the specification.

Here, unless indicated otherwise, the terms used in the specification including technical and scientific terms have the same meaning as those that are usually understood by those who skilled in the art to which the present invention pertains, and detailed description of the known functions and constitutions that may obscure the gist of the present invention will be omitted.

An apparatus for manufacturing an ingot according to the present invention is an apparatus for manufacturing a semiconductor or metal oxide ingot by sequentially inducing a liquid-to-solid phase transition of a liquid raw material following a solidification direction, the apparatus including: a crucible containing a semiconductor or metal oxide raw material; a cooling unit spaced apart from the crucible at a predetermined distance in a vertical direction, when a height direction of the crucible is designated by the vertical direction and a direction perpendicular to the vertical direction is designated by a horizontal direction; a first heating unit spaced apart from the crucible at a predetermined distance in the horizontal direction and surrounding a circumferential surface of the crucible; and an insulating member provided between the crucible and the cooling unit in the horizontal direction, a position of the insulating member is shifted by a shifting unit.

As for semiconductor or metal oxide used as a raw material for manufacturing an ingot by being contained in the crucible, examples of the semiconductor raw material may include Group 4 semiconductors including silicon (Si), germanium (Ge), and silicon germanium (SiGe); Group 3~5 semiconductors including gallium arsenide (GaAs), Indium phosphide (InP), and gallium phosphide (GaP); Group 2~6 semiconductors including cadmium sulfide (CdS) and zinc telluride (ZnTe); and Group 4~6 semiconductors including lead sulfide (PbS), and examples of the metal oxide raw material may include alumina.

The semiconductor ingot manufactured from the semiconductor raw material may include a semiconductor ingot containing Group 4 semiconductor including silicon (Si), germanium (Ge), or silicon germanium (SiGe); Group 3~5 semiconductor including gallium arsenide (GaAs), indium phosphide (InP), or gallium phosphide (GaP); Group 2~6 semiconductor including cadmium sulfide (CdS) or zinc telluride (ZnTe); or Group 4~6 semiconductor including lead sulfide (PbS), and the metal oxide ingot manufactured by the metal oxide raw material includes a sapphire ingot.

The semiconductor or metal oxide raw material contained in the crucible is melted by the heating unit and thus sequentially solidified following a predetermined solidification direction, to thereby be manufactured into an ingot. Examples of the ingot may include a polycrystalline ingot having a columnar structure, a monocrystalline-like ingot, and a monocrystalline ingot.

Monocrystalline seeds for manufacturing a monocrystalline ingot may be positioned on a bottom surface in the crucible where sequential solidification starts. Of course, in order to manufacture the monocrystalline-like ingot, a plurality of monocrystalline seeds constantly arranged may be positioned.

FIG. 1 shows an apparatus for manufacturing an ingot according to an embodiment of the present invention. As shown in (a) of FIG. 1, the apparatus for manufacturing an ingot of the present invention may include a crucible 200 containing a raw material 100 therein; when a height direction of the crucible 200 is designated by a vertical direction (V) and a direction perpendicular to the vertical direction (V) is designated by a horizontal direction (H), a cooling unit 400 spaced apart from one side of the crucible 200 at a predetermined distance in the vertical direction (V); a first heating unit 310 spaced apart from the crucible 200 at a predetermined distance in the horizontal direction (H) and surrounding the entire circumference of the crucible 200; and an insulating member 500 provided between the crucible 200 and the cooling unit 400 in the horizontal direction (H) and shifted by a shifting unit 600, the insulating member 500 being composed of two or more flat plates 501 and 502 made of an insulating material.

Preferably, the apparatus according to the present invention may further include a second heating unit 320 spaced apart from the other side of the crucible 200 at a predetermined distance in the vertical direction (V). The second heating unit 320 is spaced apart from the crucible 200 at a predetermined distance in the vertical direction such that the second heating unit 320 faces the cooling unit 400 in the vertical direction (V) with the crucible 200 therebetween.

The heating unit 300 for melting the raw material contained in the crucible 200 may include a general heating element generating Joule's heat by current. Preferably, the heating unit 300 may include the first heating unit 310 spaced from the circumferential surface of the crucible 200 at a predetermined distance to thereby surround the entire circumference of the crucible 200 and the second heating unit 320 provided above the crucible 200 such that the second heating unit 320 faces the cooling unit 400 with the crucible therebetween.

The cooling unit 400 is configured for cooling the raw material melted by the heating unit 300, and include a general cooling part having a flow channel, through which a cooling liquid flows, to thereby perform cooling by the cooling liquid. The cooling unit 400 is preferably spaced apart from a lower surface of the crucible 200 at a predetermined distance.

More preferably, the apparatus according to the present invention may include a support bar for supporting the cooling unit and a cooling unit conveyer conveying the support bar to thereby convey the cooling unit 400 in the vertical direction (V), together with the cooling unit 400 including the flat plate-shaped cooling part having the flow channel through which the cooling liquid flows. The cooling unit conveyer allows the cooling unit 400 to be conveyed, to thereby control the spaced distance between the crucible 200 and the cooling unit 400.

A heat transfer system including the shifting unit 600 and the insulating member 500 controls the heat flow in the apparatus and precisely and variably controls the inside temperatures of the crucible according to the position in the crucible and the progress time of solidification. The position of the insulating member 500 is shifted by the shifting unit 600 when the raw material is melted and sequentially solidified.

Specifically, as shown in FIG. 1, the apparatus for manufacturing an ingot may further include a control unit 700 for controlling the shifting unit 600, the heating unit 300, and the cooling unit 400 (including the cooling unit conveyer). The control unit 700 controls the position of the insulating member 500 when the raw material is melted and sequentially solidified by the heating unit 300 and the cooling unit 400, to thereby control the heat flow in the apparatus and control the temperature gradient according to the position in the crucible 200.

More specifically, the control unit 700 is characterized by opening or closing the insulating member 500 that includes two or more flat plates made of an insulating material, by the shifting unit 600, when the raw material is melted and sequentially solidified.

When the raw material is melted by the heating unit 300, the control unit 700 controls the position of the insulating member 500 to thereby shield between the crucible 200 and the cooling unit 400, as shown in (a) of FIG. 1. When the melted raw material is sequentially solidified by the cooling unit 400, the control unit 700 controls the position of the insulating member 500 to thereby form a communication region, that is, a penetration hole 1 which is a space opened in the vertical direction (V) between the crucible 200 and the cooling unit 400, as shown in (b) of FIG. 1.

For this reason, when the raw material is melted, the loss of heat generated in the heating unit 300 to the outside is minimized and the raw material contained in the crucible can be quickly melted in a short time. When the raw material is solidified by the cooling unit 400 after melting of the raw material, the solidification heat generated by solidification can be effectively removed through the penetration hole 1 formed by shifting the insulating member 500.

Here, as shown in (a) of FIG. 1, two or more flat plates 501 to 504, which are shifted and combined by the shifting unit 600 so as to form a shielding film for shielding between the crucible 200 and the cooling unit 400, are shifted and combined to thereby become a single plate, of which a projection shape has no openings therein. The diameter of the projection shape of the shielding film formed by shifting and combining the two or more flat plates 501 to 504 is preferably 1 or 1.5 times the diameter of the crucible 200.

The size of the penetration hole 1 may be controlled by the control unit 700 according to the degree of progress of sequential solidification of the raw material. Specifically, the penetration hole 1 is preferably formed such that, at the initial stage of solidification where 10% or less of the solidification, based on the total volume of raw material, is progressed, 0.1 to 0.5 times the sectional area of a cross-section of the crucible 200, in perpendicular to the vertical direction, communicates with the cooling unit 400; at the middle stage of solidification where 10~60% of solidification, based on the total volume of raw material, is progressed, 0.5 to 0.7 times the sectional area of the cross-section of the crucible 200, which is perpendicular to the vertical direction, communicates with the cooling unit 400; and at the last stage of solidification where 60% or more of solidification, based on the total volume of raw material, is progressed, 0.7 to 1.0 times the sectional area of the cross-section of the crucible 200, which is perpendicular to the vertical direction, communicates with the cooling unit 400. Here, as described above, two or more flat plates 501 to 504 constituting the insulating member 500 are independently and respectively shifted by the control unit 700 and the shifting unit 600, to thereby form the penetration hole 1. The penetration hole 1 is preferably formed such that a center of the penetration hole 1 is on an imaginary line connecting the crucible 200 and the cooling unit 400, that is, the crucible 200 and the cooling unit 400 are symmetrical to each other based on the imaginary line.

Here, the insulating member 500 is continuously or discontinuously shifted by the control unit 700 according to the progress degree of solidification, and thus, of course, the size of the penetration hole 1 may be continuously or discontinuously varied.

As described above, in the apparatus for manufacturing an ingot according to the present invention, the control unit 700 locally controls the total thickness of the insulating member 500 in the vertical direction (V) as well as controls formation or non-formation of the penetration hole 1, the size of the penetration hole 1, and the formation position of the penetration hole 1, thereby strictly controlling the temperature gradient according to the position in the crucible 200, when the raw material is melted and sequentially solidified.

As such, the heating unit 300 is provided in the vertical direction (V) and horizontal direction (H) of the crucible 200; the cooling unit 400 is provided below the crucible 200 in the vertical direction (V) of the crucible 200; and the insulating member 500 is provided between the crucible 200 and the cooling unit 400 in the vertical direction (V). Therefore, the insulating member 500 is preferably shifted in the horizontal direction in order to remove solidification heat effectively and uniformly. In the case where the insulating member 500 is composed of a plurality of flat plates made of an insulating material, it is preferable to independently shift the flat plates in the horizontal direction (H).

Here, the insulating member 500 is composed of a general insulating material including graphite or alumina. As the shifting unit 600, a general apparatus capable of shifting the position of an object in up, down, left, and right directions through electric driving is used. For example, the shifting unit 600 may include a driving part including a cylinder inducing a linear movement or a motor inducing rotation movement, a converting part connected to a driving shaft of the driving part to convert the linear movement or the rotation movement into horizontal directional movement, and a combining member applying a direction of the movement converted by the converting part to the insulating member 500.

Figure 2:
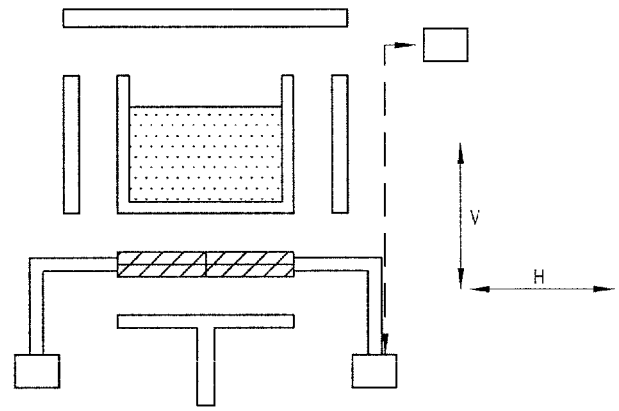
FIG. 2 is one example of an insulating member provided in the apparatus for manufacturing an ingot according to the present invention.
Figure 2:
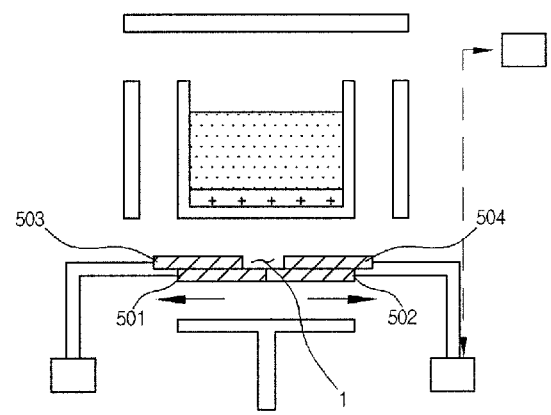
Figure 2:
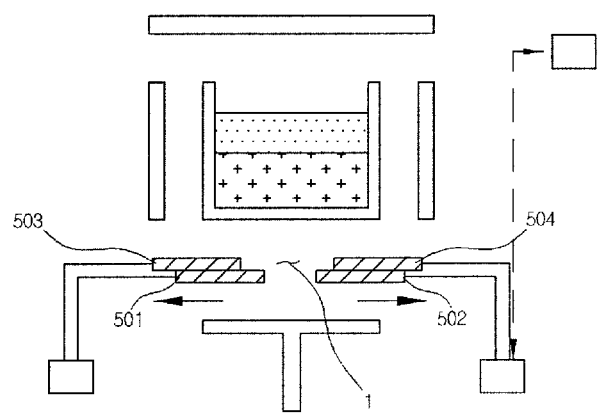

FIG. 2 shows an example of the insulating member (500) provided in the apparatus for manufacturing an ingot according to the present invention. FIG. 2 is a diagram for explaining the insulating member 500 shifted by the control unit 700 as the raw material are melted and sequentially solidified.

As shown in FIG. 2, the insulating member 500 provided in the apparatus for manufacturing an ingot according to the present invention may include two or more flat plates 501 to 504 made of an insulating material, and positions of the two or more flat plates 501 to 504 are independently and respectively shifted in the horizontal direction by shifting unit 600.

As shown in (a) of FIG. 2, when the raw material is melted in the crucible 200, the control unit 700 controls the two or more flat plates 501 to 504 to be shifted, to thereby shield between the crucible 200 and the cooling unit 400, which brings about an effect that a lower portion of the crucible is shield by an insulating material, so that the raw material may be effectively melted in a short time.

As shown in (b) and (c) of FIG. 2, in order to prevent nucleation and growth on a lateral surface of the crucible and prevent a large amount of nucleation from simultaneously occurring on a lower surface in the crucible when the melted raw material is sequentially solidified in the vertical direction (V), the control unit 700 controls two or more flat plates 501 to 504 to be shifted in the horizontal direction (H), respectively, to thereby selectively remove the solidification heat generated due to solidification of the raw material according to the position in the crucible, so that there can be manufactured a high-quality monocrystalline, monocrystalline-like or polycrystalline semiconductor ingot.

Specifically, as shown in (b) of FIG. 2, at the initial stage of solidification where solidification occurs on the lower surface in the crucible, when the flat plates (e.g., 501 and 502) positioned in the same plane is used as one flat plate layer, the flat plates 503 and 504 included in the flat plate layer close to the crucible in the vertical direction (V) are shifted in the horizontal direction (H) by a predetermined distance and the flat plates 501 and 502 included in the flat plate layer far away from the crucible forms a shielding film, thereby preventing application of an excessive nucleation driving force.

Specifically, as shown on (c) of FIG. 2, at the middle or last stage of solidification where sequential solidification is progressed in the vertical direction (V), the flat plates 501 and 502 included in the flat plate layer far away from the crucible are shifted in the horizontal direction (H) by a predetermined distance, to thereby form a penetration hole 1 having a predetermined size, and the flat plates 503 and 504 included in the flat plate layer close to the crucible are further shifted to the edge region of the lower surface of the crucible 200, thereby preventing occurrence of solidification on the lateral surface of the crucible. That is, at the middle or last stage of solidification, the flat plates are shifted such that a diameter of the penetration hole 1 in the horizontal direction (H) becomes larger as the flat plates are shifted closer to the crucible in the vertical direction (V).

Here, the shifting of the insulating member according to the stage of the solidification as shown in FIG. 2 is for only one example for more clearly explaining the control of heat flow in the apparatus at the time of manufacturing an ingot. The shifting degree of the insulating member during directional solidification may be optimized in consideration of size of the crucible, material of the crucible, amount of raw material, kind of ingot to be manufactured (monocrystalline or polycrystalline), the kind of raw material, and the like. As for the optimized utilization of the apparatus according to the present invention, the apparatus of the present invention is, of course, not limited by the shifting degree of the insulating member during directional solidification.

FIGS. 3 to 6 show cases where two or more flat plates are positioned in different planes in the vertical direction (V). Here, in the following descriptions related to FIGS. 3 to 6, the insulating member 500 of the present invention will be described in detail based on the case where the insulating member 500 shields between the crucible 200 and the cooling unit 400. Shifting directions of respective flat plates constituting the insulating member 500 by the shifting unit 600 and the control unit 700 are represented by arrows.

As shown in FIGS. 3 to 6, the insulating member 500 includes two or more flat plates made of an insulating material. The two or more flat plates each may be a polygonal plate, a polygonal plate that is hollowed, a circular plate, or a circular plate that is hollowed. The two or more flat plates are N pieces formed by dividing the polygonal plate, the polygonal plate that is hollowed, the circular plate, or the circular plate that is hollowed, into N (N=natural number of 2 or greater), and more preferably 2 to 10 pieces. The two or more flat plates are characterized by being positioned in the same plane or different planes in the vertical direction.

As shown in FIGS. 3 to 6, in the case where the two or more flat plates constituting the insulating member 500 are positioned in the different planes in the vertical direction (V), in order to minimize the loss of heat due to an opened space and more strictly control the heat flow in the apparatus when the raw material is melted by the heating unit 300, at least portions of the flat plates are closely contacted with each other in the vertical direction. Here, for more clear description on the drawings, the flat plates positioned in the different planes are spaced from each other, and then the direction in which the flat plates are closely contacted with each other is represented by using a dotted arrow.

Figure 3:
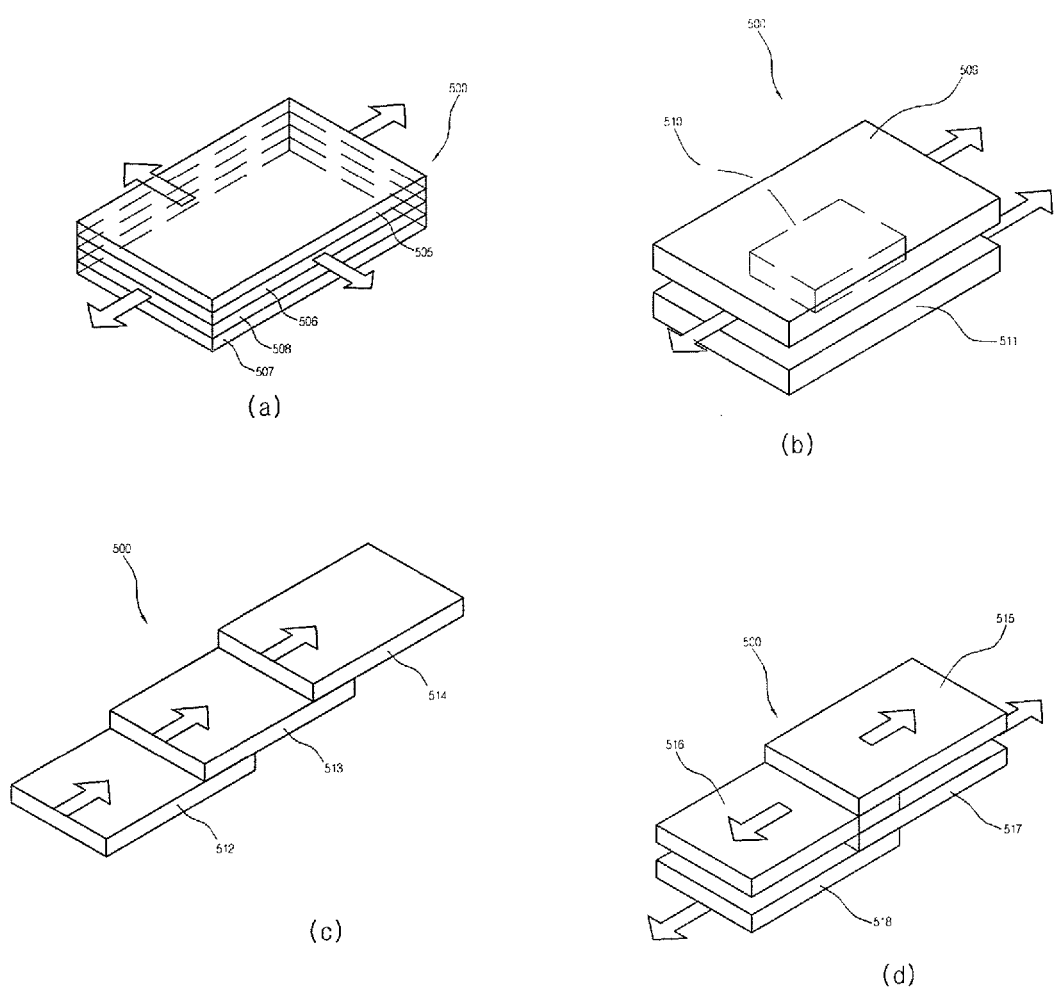
FIG. 3 is some examples of the insulating member provided in the apparatus for manufacturing an ingot according to the present invention.

Specifically, the insulating member 500 may have a structure where two or more circular- or polygonal-shaped flat plates 505 to 508 of the same size are stacked such that one surfaces of the flat plates are contacted with each other, as shown in (a) of FIG. 3; a structure where two or more circular- or polygonal-shaped flat plates 509 to 511 of different sizes are stacked such that one surface of the smallest flat plate 510 is contacted with all the other flat plates, as shown in (b) of FIG. 3; and a structure where two or more circular- or polygonal-shaped flat plates 512 to 514 or 515 to 518 of the same size or different sizes are stacked such that local regions of one surfaces thereof are contacted with each other, as shown in (c) and (d) of FIG. 3.

Figure 4:
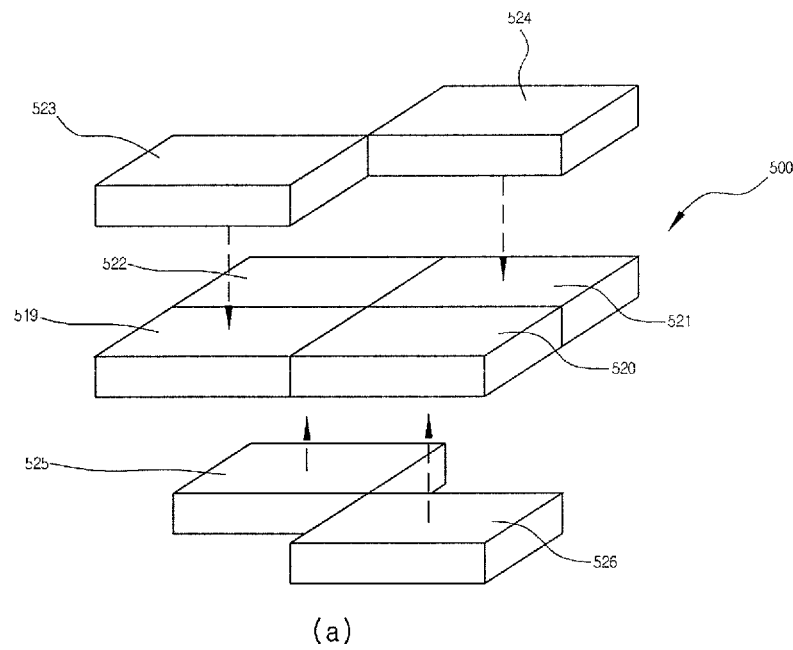
FIG. 4 is some examples of the insulating member provided in the apparatus for manufacturing an ingot according to the present invention.
Figure 4:
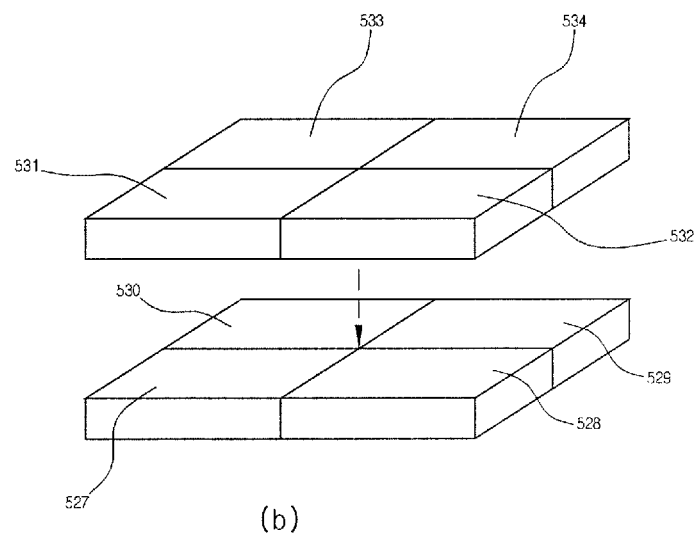
Figure 4:
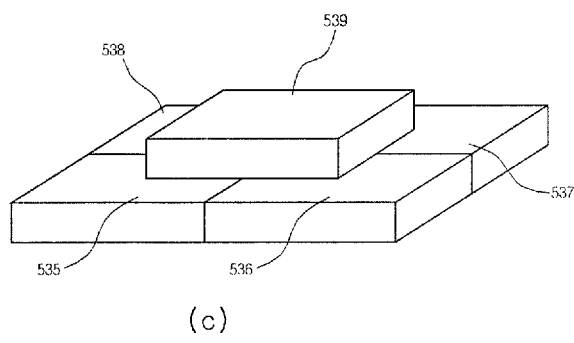

Alternatively, as shown in (a) of FIG. 4, the insulating member 500 may have a structure where N flat plates 519 to 522, which are N pieces formed by dividing a polygonal or circular plate into N (N=natural number of 2 or greater, generally, 2 to 10), are positioned in the same plane and a plurality of flat plates 523 to 526 having a size corresponding to each of the N-divided pieces are positioned above and below the N flat plates 519 to 522 such that the flat plates 523 to 526 do not face each other, as shown in (a) of FIG. 4; a structure where N flat plates 527 to 530, which are N pieces formed by dividing a polygonal or circular plate into N (N=natural number of 2 or greater), are positioned in the same plane and M flat plates 531 to 534, which are M pieces formed by dividing a polygonal or circular plate into M (M=natural number of 2 or greater), are positioned above or below the N flat plates 527 to 530, as shown in (b) of FIG. 4; and a structure where N flat plates 535 to 538, which are N pieces formed by dividing a polygonal or circular plate into N (N=natural number of 2 or greater), are positioned in the same plane and a single polygonal- or circular-shaped flat plate 539 is positioned above or below the N flat plates 535 to 538 such that a center of the single polygonal- or circular-shaped flat plate 539 is on an imaginary center line connecting the crucible 200 and the cooling unit 400, as shown in (c) of FIG. 4.

Figure 5:
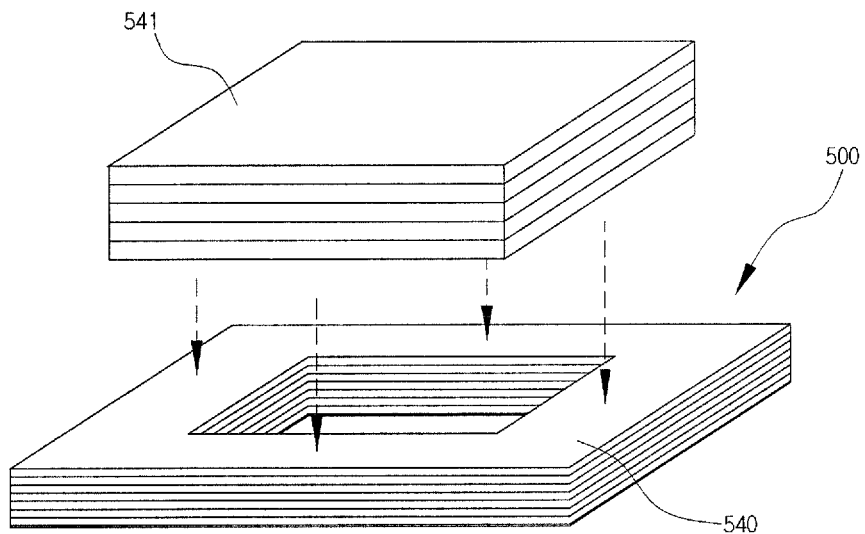
FIG. 5 is another example of the insulating member provided in the apparatus for manufacturing an ingot according to the present invention.

As shown in FIG. 5, the insulating member 500 may have a structure including two or more flat plates positioned in different planes in the vertical direction (V). Specifically, as shown in FIG. 5, the insulating member 500 may have a structure where, above or below a hollow flat plate 540, which is a polygonal plate that is hollowed or a circular plate that is hollowed, a polygonal- or circular-shaped flat plate 541 having a larger size than the hollow part of the polygonal plate or the circular plate is positioned closely to the hollow flat plate 540 such that the polygonal- or circular-shaped flat plate 541 blocks the hollow part of the hollow flat plate 540.

Figure 6:
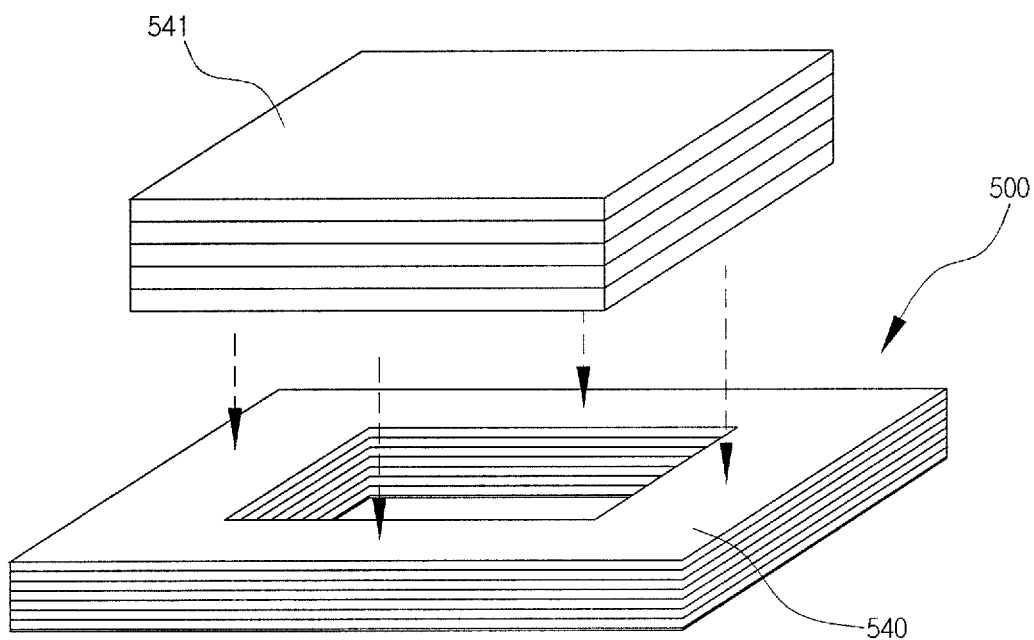
FIG. 6 is still another example of the insulating member provided in the apparatus for manufacturing an ingot according to the present invention.

Alternatively, as shown in FIG. 6, the insulating member 500 may have a structure where L flat plates 542 and 543, which are L pieces formed by dividing a polygonal plate that is hollowed or a circular plate that is hollowed, into L (L=natural number of 2 or greater), are positioned in the same plane and P flat plates 544 and 545, which are P pieces formed by dividing a polygonal or circular plate having a larger size than the hollow part of the L flat plates 542 and 543, are positioned closely above or below the L flat plates 542 and 543 such that the P flat plates 544 and 545 block the hollow part of the L flat plates 542 and 543.

As shown in FIGS. 3 to 6, in order to strictly control the removal rate of solidification heat according to the degree of progress of solidification and precisely control the removal rate of solidification heat according to the local position in the crucible, the insulating member 500 preferably has a structure where two or more flat plates are positioned not in a single plane but in different planes in the vertical directions (V) and at least portions of respective flat plates positioned in the different flat planes are closely contacted with each other in the vertical direction. Here, when the flat plates positioned in the single plane are used as one flat plate layer, the insulating member 500 is preferably composed of 2 to 6 flat plate layers.

In addition, in order to perform local control of solidification heat according to the degree of progress of solidification or variable control of solidification heat according to the time more strictly, the insulating member 500 may be preferably composed of two or more flat plates while the respective flat plates are different from each other in view of at least one factor selected from thickness, shape, size, and material thereof.

Preferably, the flat plates constituting the insulating member 500 may be made of an insulating material having heat conductivity of 1.2565 W/m° K to 65 W/m° K. Preferable examples of the insulating material satisfying the above heat conductivity may include a Styrofoam type graphite felt obtained by foaming a graphite fiber, or a graphite plate. Preferably, the flat plates constituting the insulating member 500 each are independently a graphite felt or a graphite plate.

The flat plates preferably have thicknesses of 2 cm to 12 cm, individually. In the case where the insulating member 500 includes a plurality of flat plates, which are polygonal or circular plates, as shown in FIGS. 3 and 4, the respective flat plates preferably have an area size, which are 0.2 to 0.5 times the sectional area of a cross section of the crucible 200 in perpendicular to the vertical direction. In the case where the insulating member 500 includes the flat plates, which are the hollow polygonal plates, the hollow circular plates, the divided hollow polygonal plates, or the divided hollow circular plates, as shown in FIGS. 5 and 6, each of the flat plates have preferably a hollow part, of which the center is on the imaginary center line connecting the crucible 200 and the cooling unit 400. The sectional area of the hollow part is preferably 0.1 to 0.5 times the sectional area of a cross section of the crucible 200 in perpendicular to the vertical direction. The diameter of the hollow plate, which is the polygonal plate that is hollowed or the circular plate that is hollowed (including a plate that is not divided or a plate before division) is preferably 1.0 to 1.2 times the diameter of the crucible 200.

By constituting the insulating member 500 of the flat plates made of an insulating material, satisfying the above conditions, the insulating member 500 of the present invention may serve as a shielding film preventing the loss of heat to a region other than the crucible when the raw material is melted; effectively prevent excessive occurrence of nucleation at the lower portion in the crucible by allowing the respective flat plates to be independently shifted through the control unit 700 to form the penetration hole or control the total thickness in the vertical direction of the flat plates according to the position thereof, as directive solidification of the raw material is progressed from the lower portion toward the upper portion in the crucible; effectively prevent lateral nucleation and growth due to the cooling of the lateral surface in the crucible; effectively control the shape of a solid/liquid interface and the moving rate of the solid/liquid interface; and minimize the space for shifting the flat plates in the horizontal direction to thereby enable design of the compact apparatus.

As described above, according to the structures of the insulating members shown in FIGS. 3 to 6, when the raw material in the crucible is melted by the heating unit 300, the insulating member 500 shifted by the control unit 700 and the shifting unit 600 forms the shielding film shielding between the crucible 200 and the cooling unit 400. As shown in the arrows of FIGS. 3 to 6, the control unit 700, independently, controls the respective flat plates constituting the insulating member 500 to be shifted in the horizontal direction (H) as the raw material is melted and then sequentially solidified in the crucible. The independent shifting of the flat plates by the control unit 700 means that the respective flat plates are independently shifted according to the degree of progress of solidification.

Figure 7:
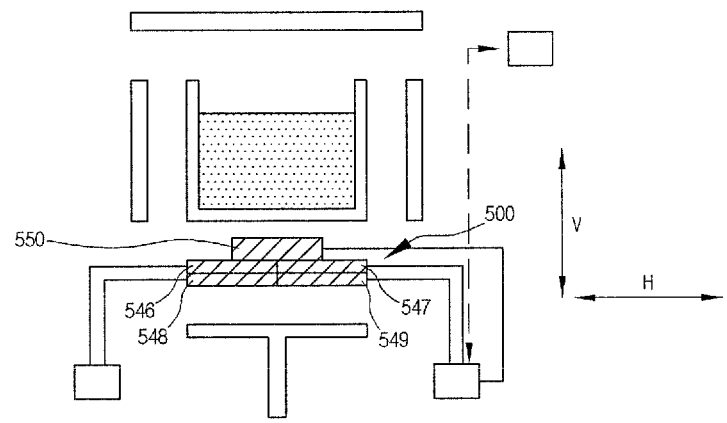
FIG. 7 is an apparatus for manufacturing an ingot according to the present invention.
Figure 7:
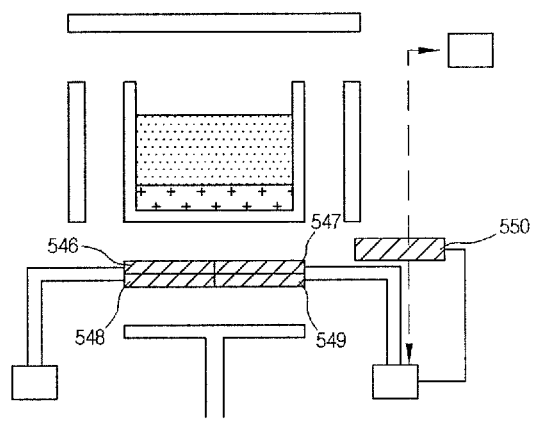
Figure 7:
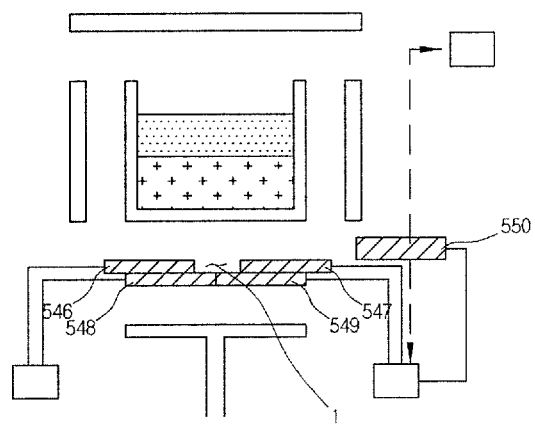

FIG. 2 shows a use example of the apparatus according to the present invention seen in view of formation of the penetration hole, but as shown in FIG. 7, the heat flow in the apparatus, specifically, the temperature according to the position in the crucible can be, of course, controlled by regulating the total thickness (total thickness in the vertical direction) of the insulating member, obtained by adding all the thicknesses in the vertical direction (V) of the plurality of flat plates positioned in the different planes.

Specifically, as shown in FIG. 7 for explaining a case where the insulating member 500 is composed of three flat plate layers, the total thickness in the vertical direction of the insulating member 500 may be different according to the position thereof. The thickness in the vertical direction of the insulating member 500 may be continuously or discontinuously controlled according to the degree of progress of solidification, by, when the raw material is melted in the crucible 200, allowing the insulating member 500 shifted by the control unit 700 and the shifting unit 600 to form a shielding film shielding between the crucible 200 and the cooling unit 400, as shown in (a) of FIG. 7; in order not to apply excessive nucleation driving force at the initial stage of solidification where solidification occurs on the bottom surface in the crucible 200, shifting and removing only a single flat plate 550, which is a polygonal or circular plate, positioned above N flat plates 546 and 547 or 548 and 549, which are N pieces formed by dividing a polygonal or circular plate into N (N=natural number of 2 or greater) positioned in the same plane, so as to prevent the single flat plate 550 from interfering in the heat flow in the apparatus, as shown in (b) of FIG. 7; and in order to prevent occurrence of solidification on the lateral surface in the crucible at the middle or last stage of solidification where sequential solidification in the vertical direction (V) is progressed, shifting only flat plates 546 and 547 included in a flat plate layer close to the crucible by a predetermined distance in the vertical direction (V) and allowing flat plates 548 and 549 included in a flat plat layer far away from the crucible to form a shielding film, as shown in (c) of FIG. 7.

That is, when the solidification is progressed, the control unit 700 controls the total thickness in the vertical direction of the insulating member 500 according to the position thereof according to the degree of progress of solidification or controls the formation or non-formation of the penetration hole and the size of the penetration hole, thereby controlling the heat transfer degree and the heat transfer area between the crucible and the cooling unit, and thus, can strictly control the temperature gradient according to the position in the crucible, so that the crystal growth rate and quality of semiconductor crystals can be controlled.

Further, in order to more strictly and effectively control and remove the solidification heat generated at the time of solidification, particularly, the solidification heat generated from the upper portion in the crucible at the last stage of solidification and strictly control the crystal growth rate of semiconductor crystals, the control unit 700 preferably controls the shifting unit 600 shifting the insulating member 500 and the cooling unit conveyer (not shown) conveying the cooling unit 400 as well as the insulating member 500, to thereby control the shifting of the insulating member 500 and the spaced distance between the crucible 200 and the cooling unit 400 according to the degree of progress of solidification.

For example, the control unit 700 can form a larger penetration hole 1 or reduce the total thickness in the vertical direction (V) of the insulating member 500 by shifting the insulating member 500 and reduce the spaced distance between the cooling unit 400 and the crucible 200 by moving the cooling unit 400 toward a lower side of the crucible, thereby more promptly controlling the crystal growth rate (solidification rate) of the raw material in the crucible 200; can form a smaller penetration hole 1 or increase the total thickness in the vertical direction (V) of the insulating member 500 by shifting the insulating member 500 and increase the spaced distance between the cooling unit 400 and the crucible 200 by shifting the cooling unit 400 to be far away from the lower side of the crucible, thereby more slowly controlling the crystal growth rate (solidification rate) of the raw material in the crucible 200.

Figure 8:
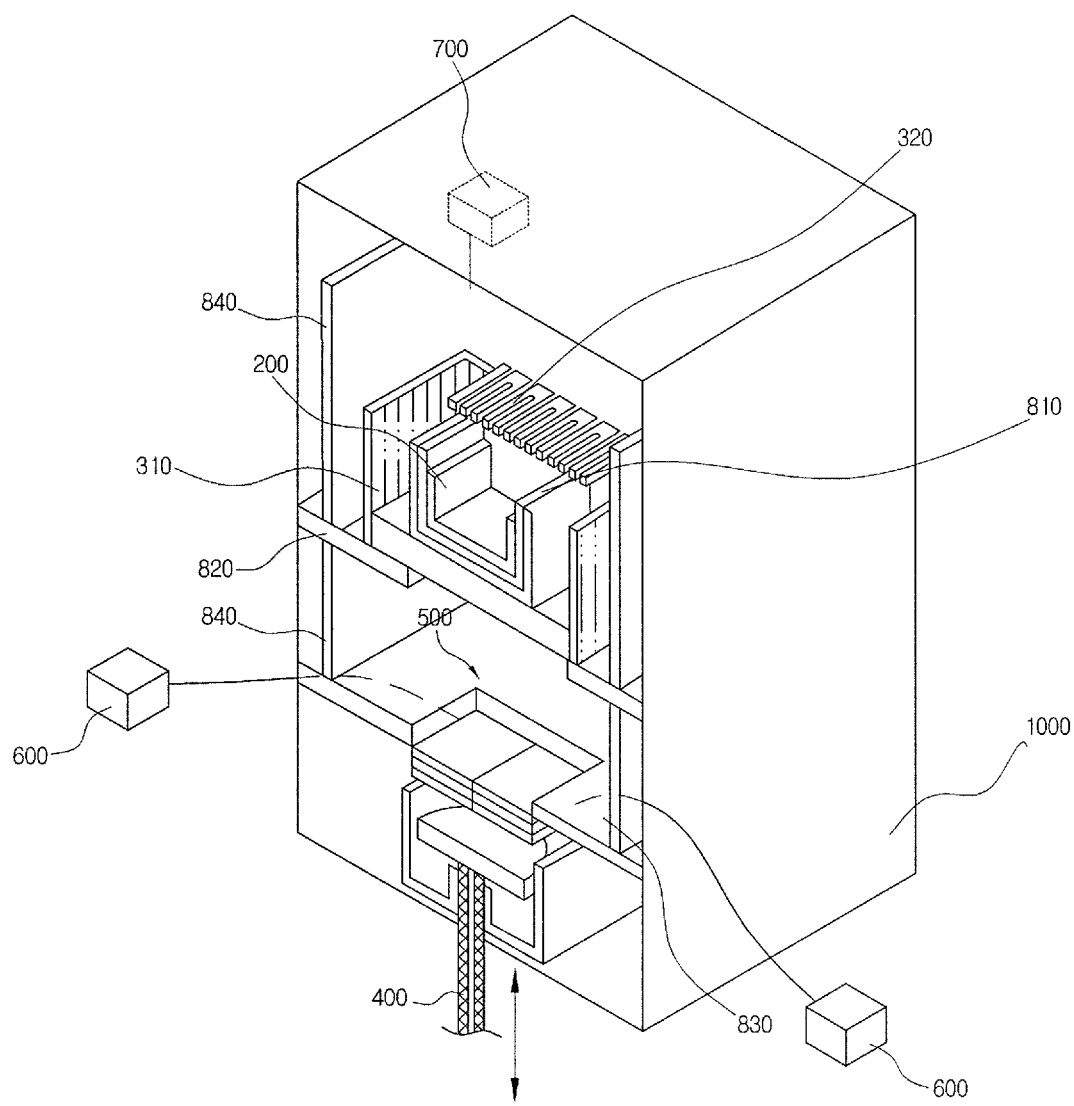
FIG. 8 is an apparatus for manufacturing an ingot according to the present invention.

FIG. 8 is a diagram showing an apparatus for manufacturing an ingot according to a preferred embodiment of the present invention. As shown in FIG. 8, an apparatus for manufacturing an ingot according to the present invention may include, together with the above-described crucible 200, heating unit 300, cooling unit 400, insulating member 500, shifting unit 600, and control unit 700, a temperature sensor (not shown) measuring a temperature of the crucible 200, a susceptor 810 wrapping an outer circumferential surface of the crucible 200 to protect the crucible 200, a crucible supporter 820 formed in a horizontal direction to support the susceptor 810, a lower insulating layer 830 having a shift hole formed by penetrating a predetermined region between the crucible 200 and the cooling unit 400, a lateral insulating layer 840 spaced apart from the heating unit at a predetermined distance in the horizontal direction and surrounding the entire circumference of the crucible 200 in order to shield the heat, which is released to the region except the crucible 200, and maintain a uniform temperature, a vacuum chamber 1000 for positioning at least the crucible 200, the temperature sensor, the susceptor 810, the crucible supporter 820, the heating unit 300, the cooling unit 400, the insulating member 500, the lower insulating layer 830, and the lateral insulating layer 840 therein, and inert gas supply and exhaust parts for supplying and exhausting an inert gas into or from the vacuum chamber 1000. Here, it is preferable to provide the insulating member 500 between the lower insulating layer 830 and the cooling unit 400, and more preferable to provide the insulating member 500 adjacently to the lower insulating layer 830 as long as the insulating member 500 is movable.

Here, together with the lateral insulating layer 840, the lower insulating layer 830, and the insulating member 500 blocking the shift hole formed in the lower insulating layer 830, there may be further provided an upper insulating layer (not shown) above the uppermost portion of the crucible 200 such that the upper insulating layer is positioned to face the lower insulating layer 830 with the crucible 200 therebetween, and hence, all the circumference portions in the horizontal direction and vertical direction of the crucible 200 are wrapped by insulators. One end in the vertical direction of the lateral insulating layer 840 is contacted with the lower insulating layer 830, and the other end in the vertical direction of the lateral insulating layer 840 is contacted with the upper insulating layer (not shown), and thus, all the circumference portions of the crucible 200 are preferably wrapped by an insulating material, except for the shift hole of the lower insulating layer 830.

Preferably, the control unit 700 receives information outputted from the temperature sensor to control the heating unit 300 and the cooling unit 400, together with the shifting unit 600, to thereby control the temperature of the crucible 200, and controls the inert gas supply and exhaust part.

In the case where the insulating member 500 is shifted by the control unit 700 and the shifting unit 600 to form the shielding film shielding between the crucible 200 and the cooling unit 400, the insulating member 500 is preferably positioned below the lower insulating layer 830 such that the insulating member 500 is closely contacted with the lower insulating layer 830, so that the insulating member 500 can block the shift hole of the lower insulating layer 830. Here, preferably, the size of the shift hole formed in the lower insulating layer 830 is equal to or smaller than the size of the shielding film formed by shifting and combining the flat plates constituting the insulating member 500. Specifically, the size of the shift hole formed in the lower insulating layer 830 is preferably 1.0 to 1.2 times the sectional area of the cross section of the crucible 200 in perpendicular to the vertical direction.

As described above, the control unit 700 is characterized by controlling the shifting unit 600 shifting the insulating member 500 and the cooling unit conveyor conveying the cooling unit 400, to thereby move the cooling unit 400 in the vertical direction as the directional solidification of the melted raw material is progressed.

When the raw material contained in the crucible 200 is melted, the control unit 700 controls the insulating member 500 to form the shielding film below the lower insulating layer 830, so as to block the shift hole of the lower insulating layer 830. At the above-described initial and middle stages of solidification, the control unit 700 moves the cooling unit 400 in the vertical direction toward the lower insulating layer 830 while shifting the insulating member 500. At the last stage of solidification, the control unit 700 moves the cooling unit 400 to pass through the shift hole of the lower insulating layer 830, to thereby position the cooling unit 400 above the lower insulating layer 830 or position the cooling unit 400 to be contacted with the lower surface of the crucible 200.

As described above, although the present invention is described by specific matters such as concrete components and the like, exemplary embodiments, and drawings, they are provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to the above-described exemplary embodiments, and the following claims as well as all modified equally or equivalently to the claims are intended to fall within the scope and spirit of the invention.

The invention claimed is:

1. An apparatus for manufacturing a semiconductor or metal oxide ingot by sequentially inducing a liquid-to-solid phase transition of a liquid raw material following a solidification direction, the apparatus comprising:
   a crucible containing a semiconductor or metal oxide raw material;
   a cooling unit spaced apart from the crucible at a predetermined distance in a vertical direction, and conveyed by a cooling unit conveyer in a vertical direction, when a height direction of the crucible is designated by the vertical direction and a direction perpendicular to the vertical direction is designated by a horizontal direction;
   a first heating unit spaced apart from the crucible at a predetermined distance in the horizontal direction and surrounding a circumferential surface of the crucible; and
   an insulating member provided between the crucible and the cooling unit in the horizontal direction, a position of the insulating member being shifted by a shifting unit; and
   a control unit controlling the shifting unit to shift the position of the insulating member, and the cooling unit conveyer,
wherein the control unit controls the respective positions of two or more flat plates, made of an insulating material, constituting the insulating member according to the progress degree of solidification, and controls the spaced distance between the crucible and the cooling unit, when the raw material is melted and sequentially solidified by the heating unit and the cooling unit.

2. The apparatus of claim 1, wherein the control unit controls respective positions of flat plates, constituting the insulating member, according to the progress degree of solidification, where 10% or less of progress of solidification is referred to as the initial stage of solidification, 10-60% of solidification progress of solidification is referred to as the middle stage of solidification, and 60% or more of progress of solidification is referred to as the last stage of solidification, based on the total volume of raw material, to thereby control a total thickness in the vertical direction of the insulating member according to the position between the crucible and the cooling unit.

3. The apparatus of claim 1, wherein the control unit controls respective positions of flat plates, constituting the insulating member, to thereby shield a lower portion of the crucible when the raw material is melted, and form a penetration hole between the crucible and the cooling unit according to the progress degree of solidification, where 10% or less of progress of solidification is referred to as the initial stage of solidification, 10-60% of solidification progress of solidification is referred to as the middle stage of solidification, and 60% or more of progress of solidification is referred to as the last stage of solidification, based on the total volume of raw material.

4. The apparatus of claim 1, wherein the two or more flat plates are different from each other in view of at least one factor selected from thickness, shape, size, and material thereof.

5. The apparatus of claim 1, wherein the insulating member is shifted in the horizontal direction by the shifting unit.

6. The apparatus of claim 1, further comprising a second heating unit spaced apart from the crucible at a predetermined distance in the vertical direction such that the second heating unit faces the cooling unit in the vertical direction with the crucible therebetween.

7. The apparatus of claim 1, wherein the insulating member includes two or more flat plates made of an insulating material, the two or more insulating flat plates being positioned in the same plane or different planes in the vertical direction.

8. The apparatus of claim 7, wherein at least portions of the insulating flat plates are closely contacted with each other in the vertical direction, in the case where the two or more flat plates are positioned in the different planes.

9. The apparatus of claim 7, wherein the two or more flat plates are N pieces formed by dividing a polygonal plate, a polygonal plate that is hollowed, a circular plate, or a circular plate that is hollowed, into N (N=natural number of 2 or greater).

10. The apparatus of claim 7, wherein the two or more flat plates each are independently a polygonal plate, a polygonal plate that is hollowed, a circular plate, or a circular plate that is hollowed.

11. The apparatus of claim 1, wherein the semiconductor is silicon (Si), germanium (Ge), or gallium arsenide (GaAs).

12. The apparatus of claim 1, wherein the metal oxide is sapphire ($Al_2O_3$).

13. The apparatus of claim 1, wherein the insulating member includes two or more flat plates made of an insulating material, the two or more insulating flat plates being positioned in the same plane or different planes in the vertical direction.

14. The apparatus of claim 3, wherein the insulating member includes two or more flat plates made of an insulating material, the two or more insulating flat plates being positioned in the same plane or different planes in the vertical direction.

15. The apparatus of claim 4, wherein the insulating member includes two or more flat plates made of an insulating material, the two or more insulating flat plates being positioned in the same plane or different planes in the vertical direction.

16. The apparatus of claim 5, wherein the insulating member includes two or more flat plates made of an insulating material, the two or more insulating flat plates being positioned in the same plane or different planes in the vertical direction.

17. The apparatus of claim 6, wherein the insulating member includes two or more flat plates made of an insulating material, the two or more insulating flat plates being positioned in the same plane or different planes in the vertical direction.

* * * * *